United States Patent
Cheung et al.

(10) Patent No.: US 11,929,411 B2
(45) Date of Patent: Mar. 12, 2024

(54) RECESSED ACCESS DEVICES AND METHODS OF FORMING A RECESSED ACCESS DEVICES

(71) Applicant: Micron Technology, Inc., Boise, ID (US)

(72) Inventors: Sau Ha Cheung, Boise, ID (US); Soichi Sugiura, Bristow, VA (US); Jaydip Guha, Boise, ID (US); Anthony Kanago, Boise, ID (US); Richard Beeler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 204 days.

(21) Appl. No.: 17/411,643

(22) Filed: Aug. 25, 2021

(65) Prior Publication Data

US 2023/0063549 A1   Mar. 2, 2023

(51) Int. Cl.
*H01L 29/423* (2006.01)
*H01L 29/40* (2006.01)
(Continued)

(52) U.S. Cl.
CPC ........ *H01L 29/4236* (2013.01); *H01L 29/401* (2013.01); *H01L 29/42368* (2013.01);
(Continued)

(58) Field of Classification Search
CPC ........... H01L 29/7825; H01L 29/66613; H01L 29/4236; H01L 29/42368; H01L 29/517;
(Continued)

(56) References Cited

U.S. PATENT DOCUMENTS

2014/0138753 A1   5/2014  Ramaswamy et al.
2015/0270362 A1*  9/2015  Kim ................. H01L 21/30604
                                                        438/589
(Continued)

FOREIGN PATENT DOCUMENTS

KR       20140028981 A  * 10/2014

OTHER PUBLICATIONS

U.S. Appl. No. 17/460,984, filed Aug. 30, 2021, by Yang et al.

*Primary Examiner* — Joseph C. Nicely
(74) *Attorney, Agent, or Firm* — Wells St. John P.S.

(57) ABSTRACT

A method of forming a recessed access device comprises forming a trench in semiconductor material. Sidewalls and a bottom of the trench are lined with low-k gate-insulator material. The low-k gate-insulator material is characterized by its dielectric constant k being no greater than 4.0. Sacrificial material is formed in a bottom portion of the trench over the low-k gate-insulator material and over the trench bottom. A high-k gate-insulator material is formed in an upper portion of the trench above the sacrificial material and laterally-inward of the low-k gate-insulator material that is in the upper portion of the trench. The high-k gate-insulator material is characterized by its dielectric constant k being greater than 4.0. The sacrificial material is replaced with a conductive gate that has its top above a bottom of the high-k gate-insulator material. A pair of source/drain regions is formed in upper portions of the semiconductor material on opposing lateral sides of the trench. A channel region is in the semiconductor material below the pair of source/drain regions and extends along the trench sidewalls and around the trench bottom. Other embodiments, including structure independent of method, are disclosed.

14 Claims, 11 Drawing Sheets

(51) Int. Cl.
*H01L 29/51* (2006.01)
*H10B 12/00* (2023.01)

(52) U.S. Cl.
CPC ......... *H01L 29/512* (2013.01); *H10B 12/053* (2023.02); *H10B 12/34* (2023.02)

(58) Field of Classification Search
CPC ............. H01L 29/511; H01L 29/42364; H01L 29/512; H01L 29/513; H01L 21/022; H10B 12/34
See application file for complete search history.

(56) References Cited

U.S. PATENT DOCUMENTS

2021/0050420 A1\* 2/2021 Lee ....................... H01L 29/518
2022/0115511 A1 4/2022 An et al.

\* cited by examiner

RECESSED ACCESS DEVICES AND METHODS OF FORMING A RECESSED ACCESS DEVICES

TECHNICAL FIELD

Embodiments disclosed herein pertain to recessed access devices and to methods of forming recessed access devices.

BACKGROUND

A recessed access device is a field effect transistor having its gate construction buried within a trench formed in semiconductive material. The gate construction includes a gate insulator which lines the trench and conductive gate material within the trench laterally inward of the gate insulator. A source/drain region is formed in outermost regions of the semiconductive material on each of opposing sides of the trench. When the two source/drain regions are at different voltages and a suitable voltage is applied to the conductive gate material, current ($I_{on}$) flows through the semiconductive material between the source/drain regions along the trench sidewalls and around the base of the trench (i.e., a conductive channel forms through which current flows between the two source/drain regions). Recessed access devices are typically devoid of non-volatile charge-storage devices (yet may be fabricated to include such), and regardless may be used in memory circuitry, for example DRAM circuitry. It is desirable to attain high device on-current ($I_{on}$) and low device off-current (e.g., leakage current $I_{off}$) in recessed access devices.

DETAILED DESCRIPTION OF EXAMPLE EMBODIMENTS

Figure 1:
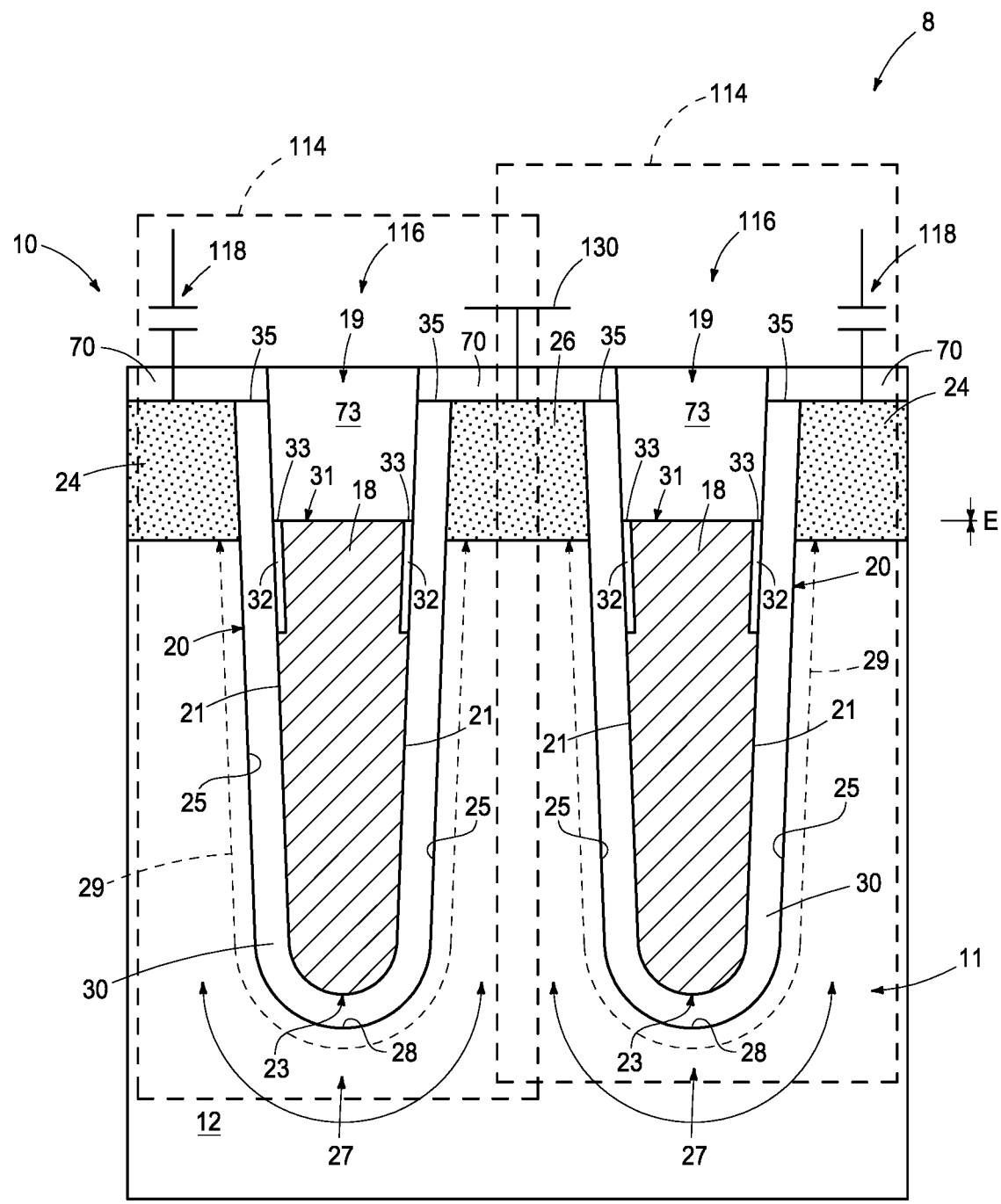
FIG. 1 is a diagrammatic cross-sectional view of multiple recessed access devices in DRAM in accordance with an embodiment of the invention.

Embodiments of the invention encompass recessed access devices, for example as might be in DRAM constructions, and methods of forming recessed access devices. First example embodiments are initially described with reference to FIG. 1 which shows an example fragment of a substrate construction 8 comprising a memory array or memory array area 10 that in one embodiment comprises memory cells 114 individually comprising a recessed access device/transistor 116 and a charge-storage device 118 (e.g., a capacitor). Memory cells 114 have been fabricated relative to a base substrate 11. Base substrate 11 may comprise any one or more of conductive/conductor/conducting (i.e., electrically herein), semiconductive/semiconductor/semiconducting, and insulative/insulator/insulating (i.e., electrically herein) materials. Materials may be aside, elevationally inward, or elevationally outward of the FIG. 1—depicted materials. For example, other partially or wholly fabricated components of integrated circuitry may be provided somewhere above, about, or within base substrate 11. Control and/or other peripheral circuitry for operating components within a memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array.

Example base substrate 11 comprises semiconductor material 12 (e.g., appropriately and variously doped monocrystalline silicon and/or other semiconductive material) comprising a pair of recessed access devices 116. FIG. 1 shows recessed access devices 116 as part of memory circuitry although recessed access devices in accordance with the invention might be in any integrated circuitry. The discussion largely proceeds with respect to a single recessed access device 116. Such comprises a conductive gate 18 (e.g., a buried access line) in a trench 19 in semiconductor material 12. In one embodiment, conductive gate 18 consists essentially of or consists of metal material. Example conductive gate 18 has a top 31 that may be planar (as shown). An insulator material 73 (e.g., silicon dioxide, silicon nitride, a material having a dielectric constant k no greater than 4.0, or a material having a dielectric constant k greater than 4.0) may be over conductive gate 18. An insulator material 70 (e.g., silicon dioxide and/or silicon nitride) may be over semiconductor material 12. A gate insulator 20 extends along sidewalls 21 and around a bottom 23 of conductive gate 18 between conductive gate 18 and semiconductor material 12.

A pair of source/drain regions 24, 26 are in upper portions of semiconductor material 12 on opposing lateral sides of trench 19. Each of source/drain regions 24, 26 likely comprises at least a part thereof having a conductivity-increasing dopant therein that is of maximum concentration of such conductivity-increasing dopant within the respective source/drain region 24, 26, for example to render such part to be conductive (e.g., having a maximum dopant concentration of at least $10^{19}$ atoms/cm$^3$). Accordingly, all or only a part of each source/drain region 24, 26 may have such maximum concentration of conductivity-increasing dopant (indicated by stippling). Source/drain regions 24 and/or 26 may include other doped regions (not shown), for example halo regions, LDD regions, etc.

In the depicted example, one of the source/drain regions (e.g., region 26) of the pair of source/drain regions is laterally between conductive gates 18 and is shared by immediately-adjacent recessed access devices 116. Others of the source/drain regions (e.g., regions 24) of individual of the pairs of source/drain regions are not shared by immediately-adjacent recessed access devices 116. A digitline 130 is directly electrically coupled to the one shared source/drain region 26. A pair of capacitors 118 individually are directly electrically coupled to one of the other source/drain regions 24.

Example recessed access devices 116 comprise a channel region 27 that is in the semiconductor material 12 below the pair of source/drain regions 24, 26 and extends along sidewalls 25 and around a bottom 28 of trench 19. Channel region 27 may be suitably doped with a conductivity-increasing dopant likely of the opposite conductivity-type of the dopant in source/drain regions 24, 26, and for example that is at a maximum concentration in the channel of no greater than $1\times10^{16}$ atoms/cm$^3$. When suitable voltage is applied to conductive gate 18, a conductive channel forms (e.g., along a channel current-flow line/path 29) within channel region 27 proximate gate insulator 20 such that current can flow between pair of source/drain regions 24 and 26.

Gate insulator 20 comprises a low-k material 30 (in some embodiments referred to as low-k gate-insulator material) and a high-k material 32 (in some embodiments referred to as high-k gate-insulator material). Low-k material 30 is characterized by its dielectric constant k being no greater than 4.0 (e.g., no less than 0.5) and high-k material 32 is characterized by its dielectric constant k being greater than 4.0 (e.g., no greater than 60). In one embodiment and as shown, low-k material 30 extends completely along all of sidewalls 21 of and directly under bottom 23 of conductive gate 18. High-k material 32 is laterally-inward of low-k material 30 and is at least one of (a) and (b), where:
- (a): extending less-than-completely along all of sidewalls 21 of conductive gate 18; and
- (b): not being directly under bottom 23 of conductive gate 18.

In one embodiment, the high-k material is the (a), in one embodiment is the (b), and in one embodiment is the (a) and the (b). FIG. 1 shows an example where high-k material 32 is each of the (a), the (b), and the (a) and the (b). In one embodiment, low-k material 30 has a top 35 that is above top 31 of conductive gate 18. Low-k material 30 may be homogenous or non-homogenous as may be high-k material 32.

In one embodiment, low-k material 30 has its dielectric constant k at 3.0 to 4.0 and high-k material 32 has its dielectric constant k at 10.0 to 40.0. By way of examples only, example low-k materials are one or more of silicon dioxide, silicon oxynitrides, carbon-doped silicon dioxide, and carbon-doped silicon oxynitrides (any of which may or may not be stoichiometric). By way of examples only, example high-k materials are one or more of hafnium oxide, zirconium oxide, lanthanum oxide, lutetium oxide, titanium oxide, and strontium oxide (any of which may or may not be stoichiometric).

In one embodiment, high-k material 32 is thinner than low-k material 30. In one such embodiment, high-k material 32 has maximum lateral thickness that is 1% to 60% of that of low-k material 30, in one such embodiment that is no more than 50% of that of low-k material 30, and in one such embodiment that is no more than 10% of that of the low-k material 30. Specific examples are 10 to 50 Angstroms for low-k material 30 and 1 to 50 Angstroms for high-k material 32.

In one embodiment, high-k material 32 covers 10% to 95% of the sidewalls of conductive gate 18. Herein, "sidewalls" regarding a specific numerically-stated "covers" percentage is with respect to all the outer surfaces of the conductive gate but for (i.e., not including) that of the lowermost extent (e.g., bottom 23) and the uppermost extent (e.g., top 31) of the conductive gate. In one such embodiment, high-k material 32 covers less than 50% of the sidewalls of conductive gate 18 and in one such embodiment covers 10% to 25% of the sidewalls of conductive gate 18.

In one embodiment, high-k material 32 is aside top 31 of conductive gate 18 at an elevation of the top of the conductive gate (e.g., at elevation E). In one such embodiment, high-k material 32 has a top 33 that is at the elevation of top 31 of conductive gate 18 and in one such embodiment tops 31 and 33 are individually planar and are collectively co-planar.

Any other attribute(s) or aspect(s) as shown and/or described herein with respect to other embodiments may be used in the embodiments shown and described with reference to the above embodiments.

Figure 2:
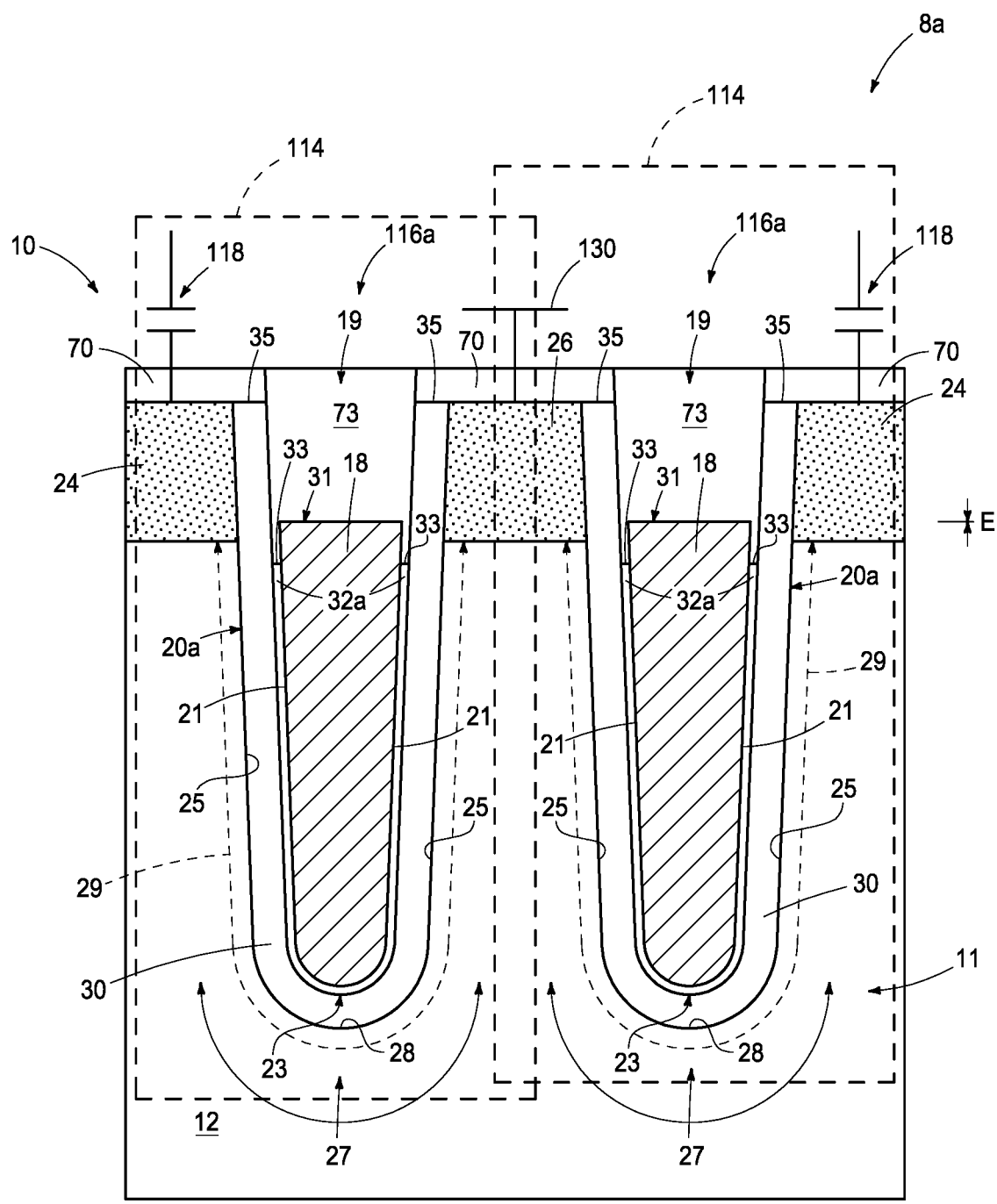
FIGS. 2-5 are diagrammatic cross-sectional views of one or more recessed access device(s) in accordance with embodiments of the invention.

An alternate example embodiment construction 8a comprising a pair of recessed access devices 116a is shown in FIG. 2. Like numerals from the above-described embodiments have been used where appropriate, with some construction differences being indicated with the suffix "a". In construction 8a, high-k material 32a of gate insulator 20a is directly under bottom 23 of conductive gate 18 and top 33 of high-k material 32a is below top 31 of conductive gate 18 (e.g., high-k material 32a is the (a) and is not the (b) [i.e., the "not" "not" double negative inherent in "not the (b)" meaning that the gate insulator is directly under the bottom of the conductive gate]). In construction 8a, high-k material 32a is vertically recessed from top 31 of conductive gate 18 on both lateral sides of conductive gate 18. Also, in construction 8a, high-k material 32a covers more than 50% of the sidewalls of conductive gate 18, and in one such embodiment covers 60% to 85% of the sidewalls of conductive gate 18. Any other attribute(s) or aspect(s) as shown and/or described herein with respect to other embodiments may be used.

Figure 3:
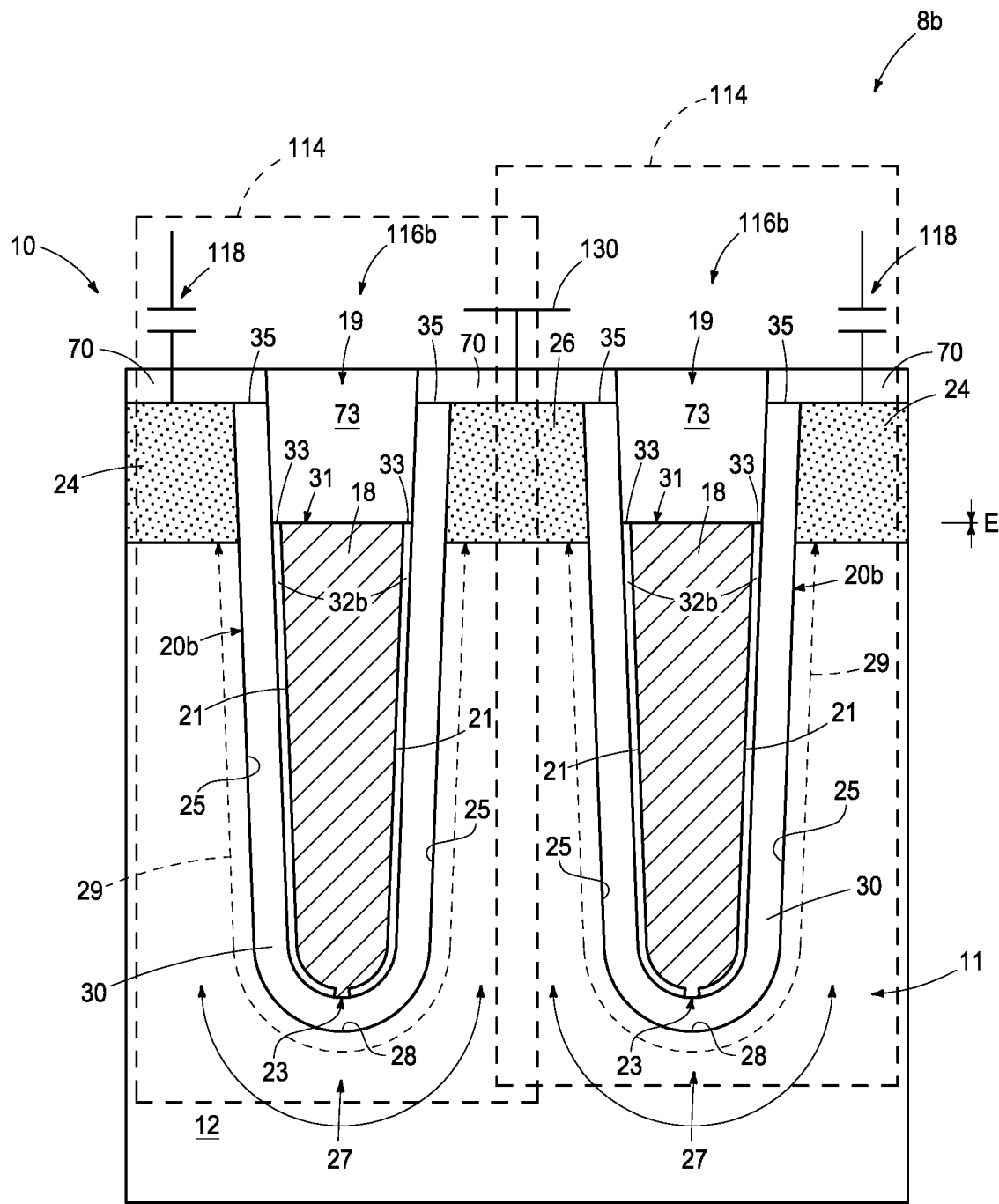

An alternate example embodiment construction 8b comprising a pair of recessed access devices 116b is shown in FIG. 3. Like numerals from the above-described embodiments have been used where appropriate, with some construction differences being indicated with the suffix "b". In construction 8b, high-k material 32b of gate insulator 20b is not directly under bottom 23 of conductive gate 18 and extends completely along all of sidewalls 21 of conductive gate 18 (e.g., high-k material 32b is not the (a) and is the (b)). Any other attribute(s) or aspect(s) as shown and/or described herein with respect to other embodiments may be used.

Figure 4:
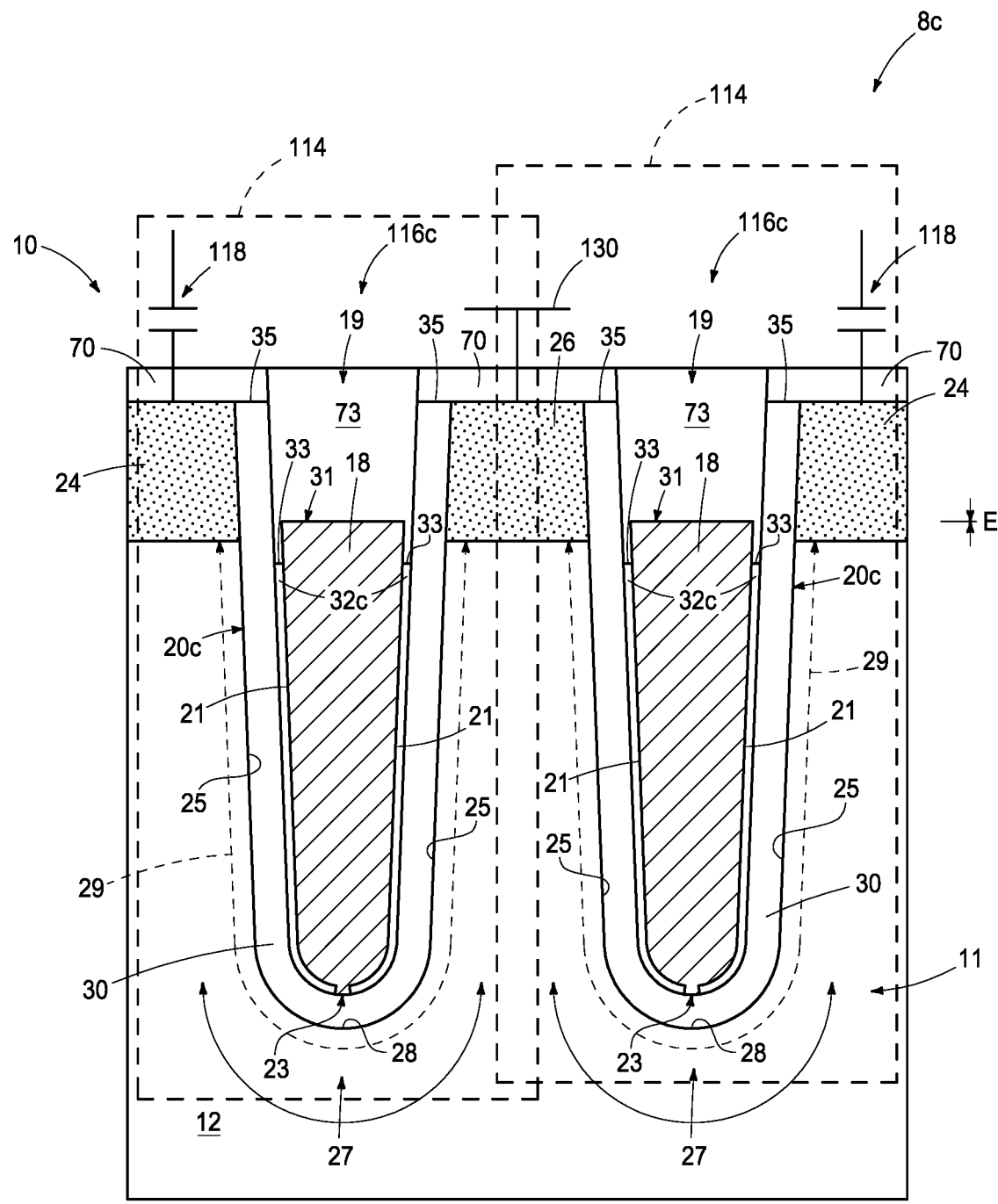

An alternate example embodiment construction 8c comprising a pair of recessed access devices 116c is shown in FIG. 4. Like numerals from the above-described embodiments have been used where appropriate, with some construction differences being indicated with the suffix "c". In construction 8c, high-k material 32c of gate insulator 20c is vertically recessed from top 31 of conductive gate 18 on both lateral sides of conductive gate 18 and high-k material 32c is not directly under bottom 23 of conductive gate 18 (e.g., high-k material 32c is the (a) and is the (b)). Any other attribute(s) or aspect(s) as shown and/or described herein with respect to other embodiments may be used.

Figure 5:
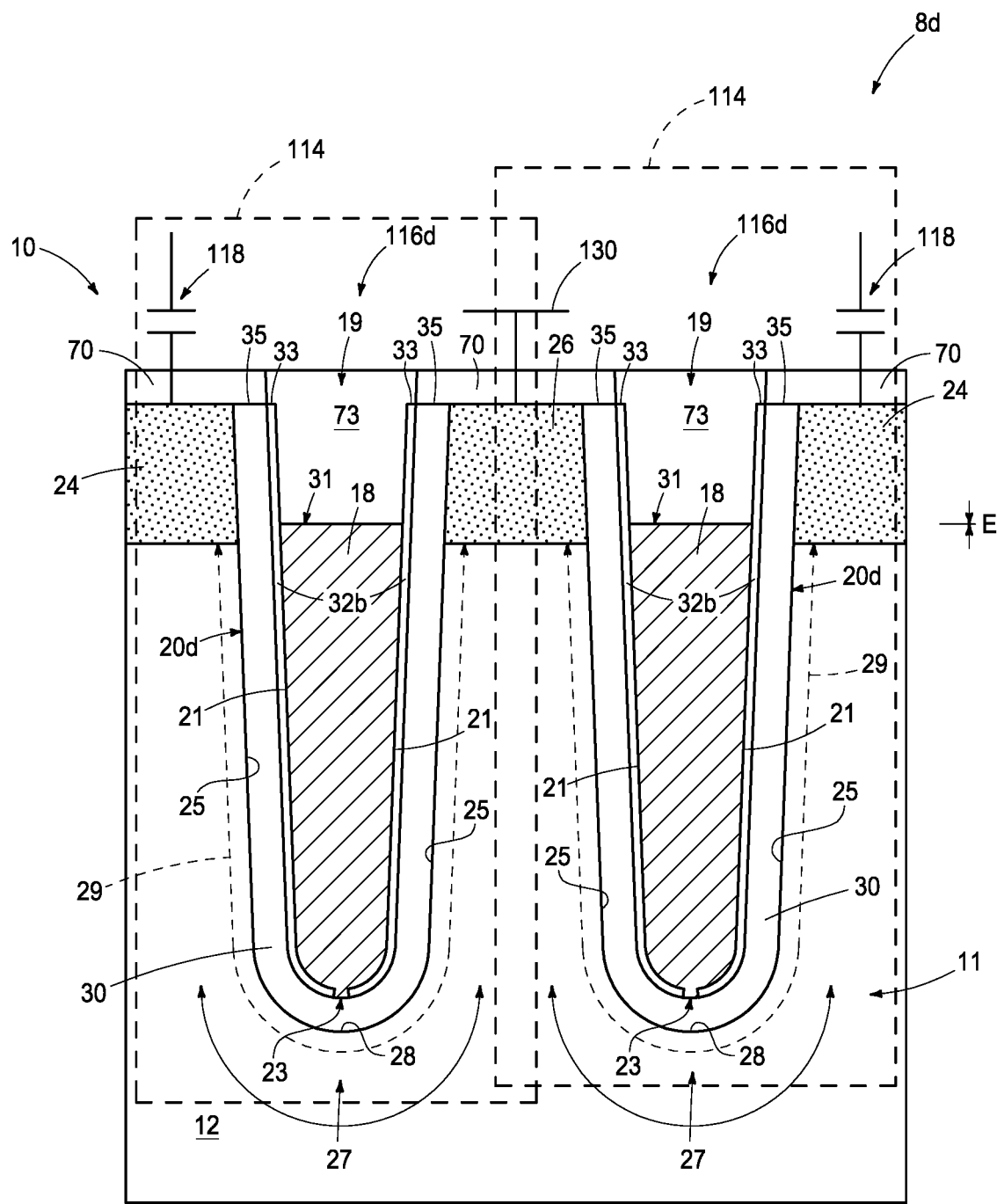

An alternate example embodiment construction 8d comprising a pair of recessed access devices 116d is shown in FIG. 5. Like numerals from the above-described embodiments have been used where appropriate, with some construction differences being indicated with the suffix "d". In construction 8d, high-k material 32d of gate insulator 32d is aside top 31 of conductive gate 18 at an elevation of top 31 of conductive gate 18, with high-k material 32d having its top 33d above the elevation of top 31 of conductive gate 18. In one such embodiment and as shown, high-k material 32d is not directly under bottom 23 of conductive gate 18 (e.g., high-k material 32d is the (b) and is not the (a)). Any other attribute(s) or aspect(s) as shown and/or described herein with respect to other embodiments may be used.

A possible, although not required, advantage of some embodiments of the invention over some constructions of the prior art is reduction of a phenomenon known as gate-induced-drain-leakage (GIDL) at an LDD junction when such a junction is present. Such reduced GIDL may enable use of an all-metal-material gate 18 as opposed to conductive polysilicon-over-metal material of some prior art gate constructions which may thereby increase conductivity (reduce resistance) of gate 18.

Embodiments of the invention encompass methods of forming a recessed access device. Embodiments of the invention encompass a recessed access device independent of method of manufacture. Nevertheless, such recessed access device may have any of the attributes as described herein in method embodiments. Likewise, the described method embodiments may incorporate, form, and/or have any of the attributes described with respect to structure embodiments.

An example method of forming a recessed access device in accordance with an embodiment of the invention is described with reference to FIGS. 6-12. Like numerals from the above embodiments have been used for predecessor constructions. The discussion largely proceeds in the fabrication of a single recessed access device.

Figure 6:
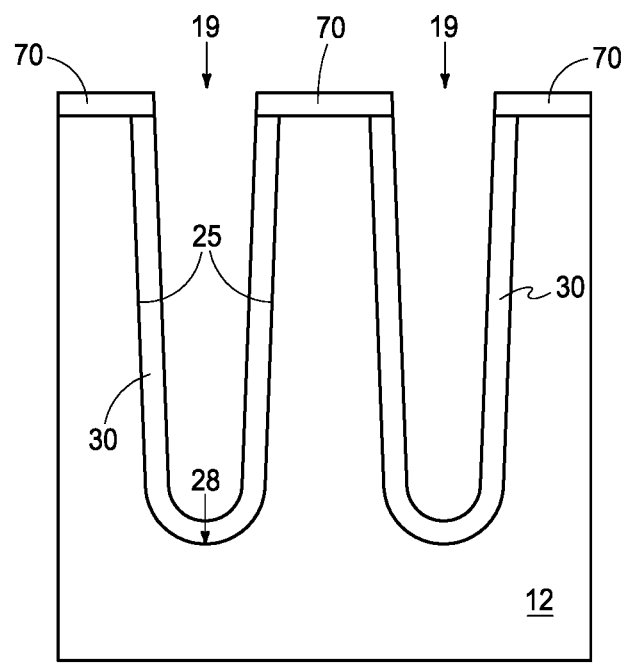
FIGS. 6-15 show example methods of forming a recessed access device in accordance with embodiments of the invention.

Referring to FIG. 6, a trench 19 has been formed in semiconductor material 12 (e.g., by photolithography and etch). Insulator material 70 may be over semiconductor material 12 and if so trench 19 may also be formed therethrough. Sidewalls 25 and bottom 28 of trench 19 have been lined with low-k gate-insulator material 30 that is characterized by its dielectric constant k being no greater than 4.0. In one embodiment, semiconductor material 12 comprises silicon and the lining of trench sidewalls 25 and trench bottom 28 with low-k gate-insulator material 30 comprises oxidizing such silicon to form $SiO_2$ (e.g., by in situ steam generation). In one such embodiment, a layer (not shown) of $SiO_2$ may be atomic-layer-deposited over trench sidewalls 25 and trench bottom 28 prior to such oxidizing. Regardless, sidewalls 25 and bottom 28 may move laterally-out and down, respectively, during such oxidizing due to transformation of material 12 to material 30 by such oxidizing.

Figure 7:
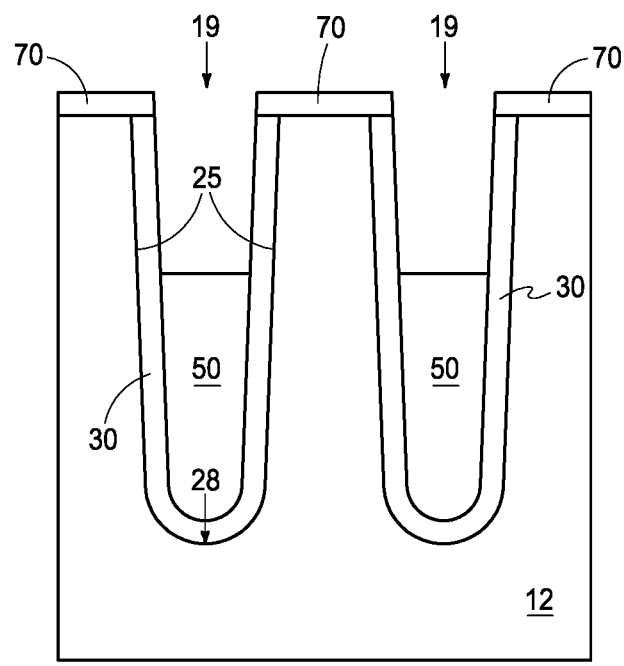

Referring to FIG. 7, sacrificial material 50 has been formed in a bottom portion of trench 19 over low-k gate-insulator material 30 and over trench bottom 28. Such may comprise any suitable conductive, insulative, and/or semi-conductive material, with TiN being but one example. Such may be formed by overfilling remaining volume of trench 19 from FIG. 6, followed by etching such back from being received laterally-outward of and above trench 19. In one embodiment and as shown, sacrificial material 50 has been formed to fill more than half of the remaining volume of trench 19 after lining sidewalls 25 and bottom 28 thereof with low-k gate-insulator material 30, for example where it is desired that the ultimate high-k gate-insulator material to be formed be over less than 50% of the sidewalls of the conductive gate to-be-formed.

Figure 8:
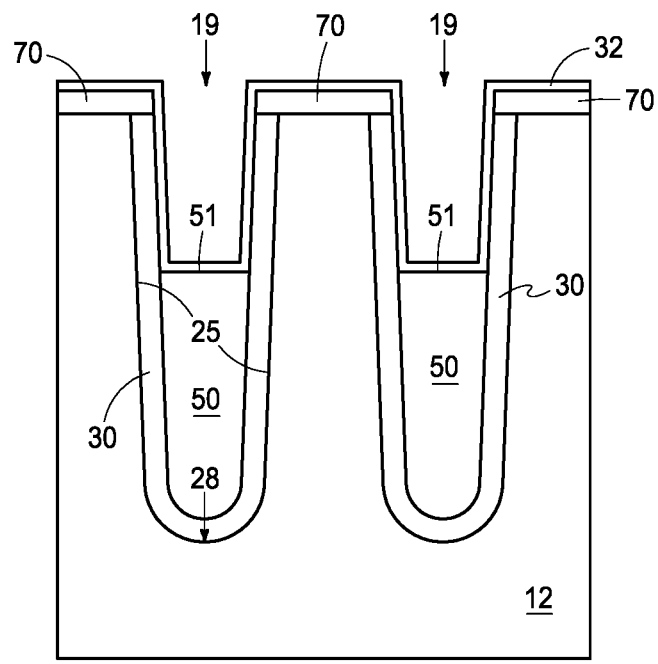

Referring to FIG. 8, a high-k gate-insulator material 32 has been formed in an upper portion of trench 19 above sacrificial material 50 and laterally-inward of low-k gate-insulator material 30 that is in the upper portion of trench 19. High-k gate-insulator material 32 is characterized by its dielectric constant k being greater than 4.0. In one embodiment and as shown, high-k gate-insulator material 32 has been formed to completely cover a top 51 of sacrificial material 50. Alternately, and by way of example only, such may not be so formed, for example by using a deposition technique for forming high-k gate-insulator material 32 in a manner that is highly selective to deposit on (directly against) low-k gate-insulator material 30 relative and not on sacrificial material 50 (not shown).

Figure 9:
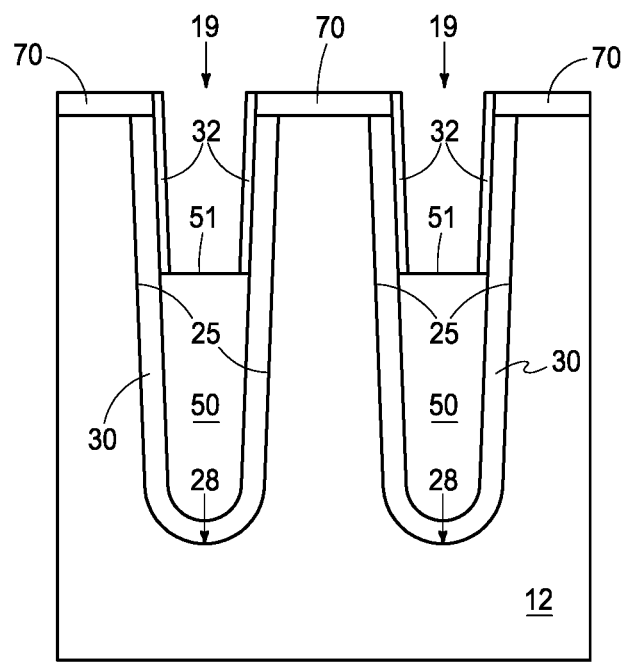

Referring to FIG. 9, and in one embodiment, high-k gate-insulator material 32 has been removed (e.g., by maskless anisotropic etching) from centrally-covering top 51 of sacrificial material 50.

Figure 10:
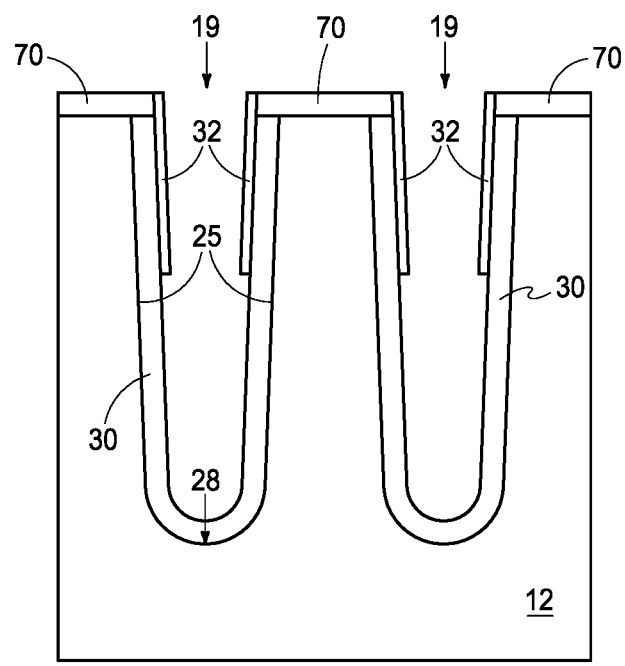

Referring to FIG. 10, sacrificial material 50 (not shown) has been removed from trench 19 (e.g., by isotropic etching).

Figure 11:
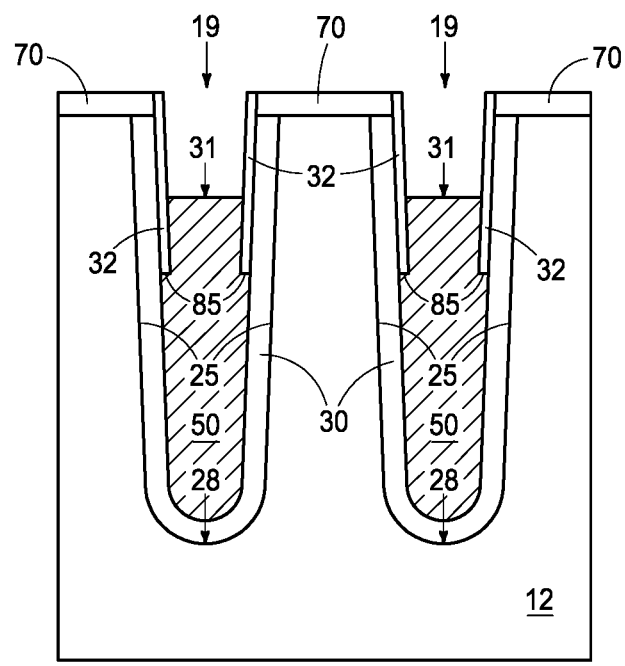

Referring to FIG. 11, conductive gate 18 has been formed to have its top 31 above a bottom 85 of high-k gate-insulator material 32. Such may be formed, by way of example, by filling remaining volume of trench 19 with conductive material and removing such back to have an example construction as shown. Such is but one example of replacing sacrificial material 50 (not shown) with a conductive gate 18 that has its top 31 above bottom 85 of high-k gate-insulator material 32.

Figure 12:
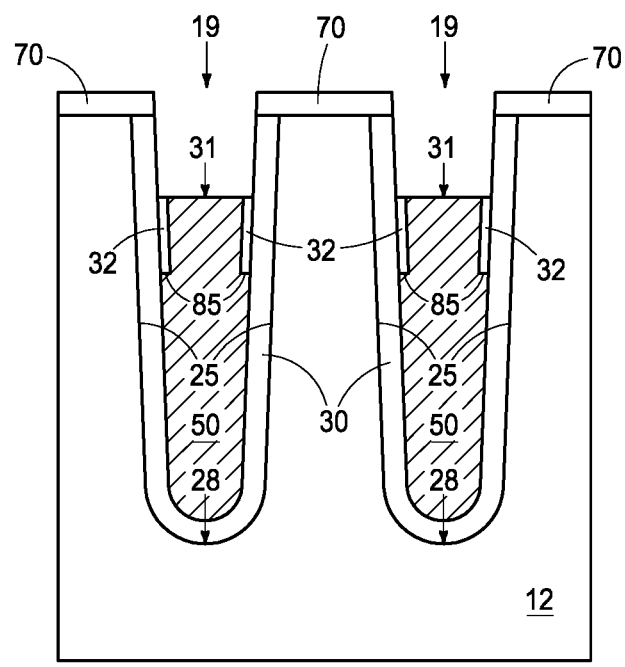

FIG. 12 shows example subsequent removal of high-k gate-insulator material 32 from being above conductive gate 18. A construction largely as shown in FIG. 1 with respect to components/materials 18, 32 is thereby formed.

Regardless, and as shown in FIG. 1, in an example method, a pair of source/drain regions 24, 26 is formed in upper portions of semiconductor material 12 on opposing lateral sides of trench 19. Further, a channel region 27 is in semiconductor material 12 below the pair of source/drain regions and extends along trench sidewalls 25 and around trench bottom 28. In one embodiment, the replacing comprises isotropically etching the sacrificial material, with such isotropic etching being conducted selectively relative to the high-k and low-k gate-insulator materials from beginning-to-end of such isotropic etching. In one embodiment, top 31 of conductive gate 18 is formed to be planar and top 33 of high-k gate-insulator material 32 is formed to be planar and co-planar with top 31 of conductive gate 18. Alternate and/or additional processing may be used to form any of the constructions of FIGS. 2-5.

Any other attribute(s) or aspect(s) as shown and/or described herein with respect to other embodiments may be used.

An alternate example method of forming a recessed access device is described with reference to FIGS. 13-15 and 2 and/or 4. Like numerals from the above-described embodiments have been used where appropriate.

Figure 13:
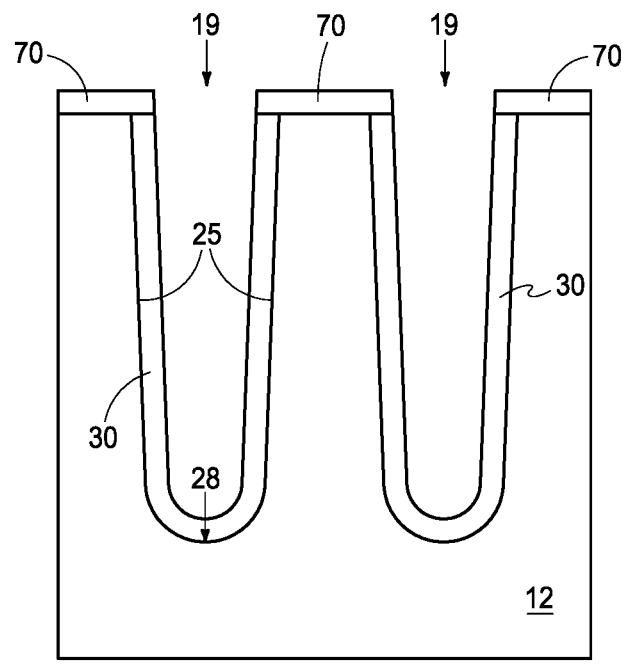

Referring to FIG. 13, a trench 19 has been formed in semiconductor material 12. Sidewalls 25 and a bottom 28 of trench 19 have been lined with low-k gate-insulator material 30 that is characterized by its dielectric constant k being no greater than 4.0.

Figure 14:
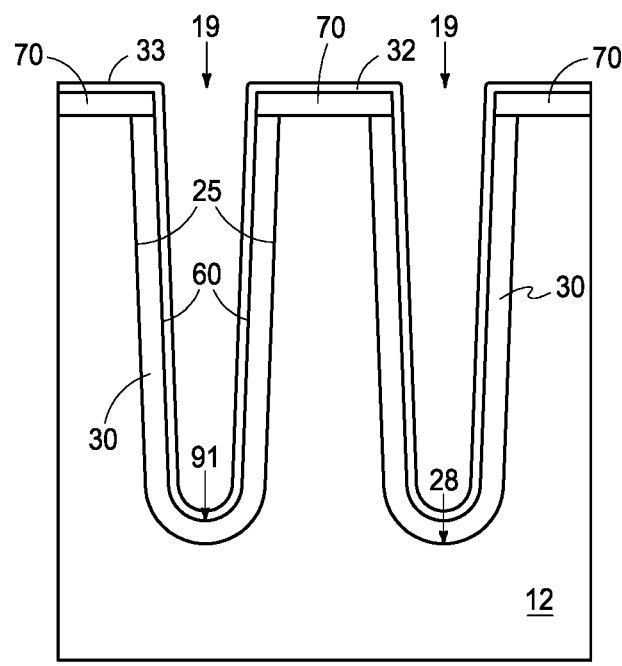

Referring to FIG. 14, a high-k gate-insulator material 32 has been formed in trench 19 over sidewalls 60 and directly above a bottom 91 of low-k gate-insulator material 30. High-k gate-insulator material 32 is characterized by its dielectric constant k being greater than 4.0.

Figure 15:
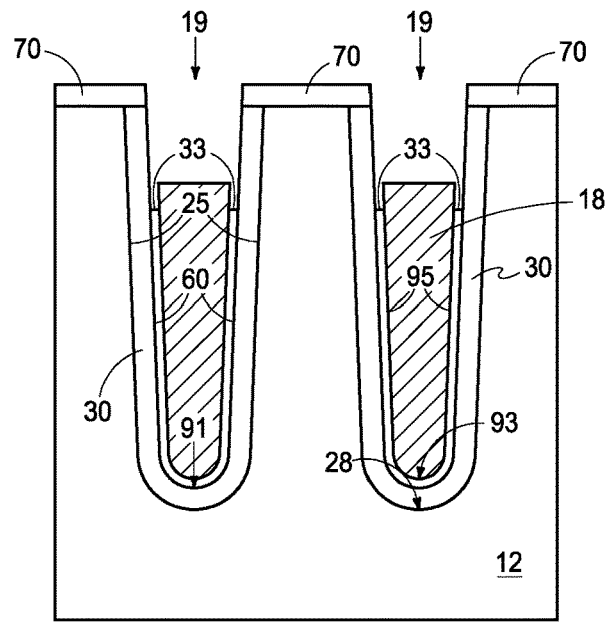

Referring to FIG. 15, a conductive gate 18 has been formed in trench 19 over sidewalls 95 and a bottom 93 of high-k gate-insulator material 32. High-k gate-insulator material 32 has a top 33 that is below top 31 of conductive gate 18. In one embodiment, high-k gate-insulator material 32 is formed to have its top 33 be above top 31 of conductive gate 18 (FIG. 14) prior to having its top 33 be below top 31 of conductive gate 18. In one such embodiment, high-k gate-insulator material 32 is etched selectively relative to low-k gate-insulator material 30 from beginning-to-end of such isotropic etching to have top 33 of high-k gate-insulator material 32 be below top 31 of conductive gate 18.

Referring to FIGS. 2 and/or 4, a pair of source/drain regions 24, 26 are formed in upper portions of semiconductor material 12 on opposing lateral sides of trench 19. A channel region 27 is ultimately provided in semiconductor material 12 below pair of source/drain regions 24, 26 and extends along trench sidewalls 25 and around trench bottom 28. Any other attribute(s) or aspect(s) as shown and/or described herein with respect to other embodiments may be used.

Figure 16:
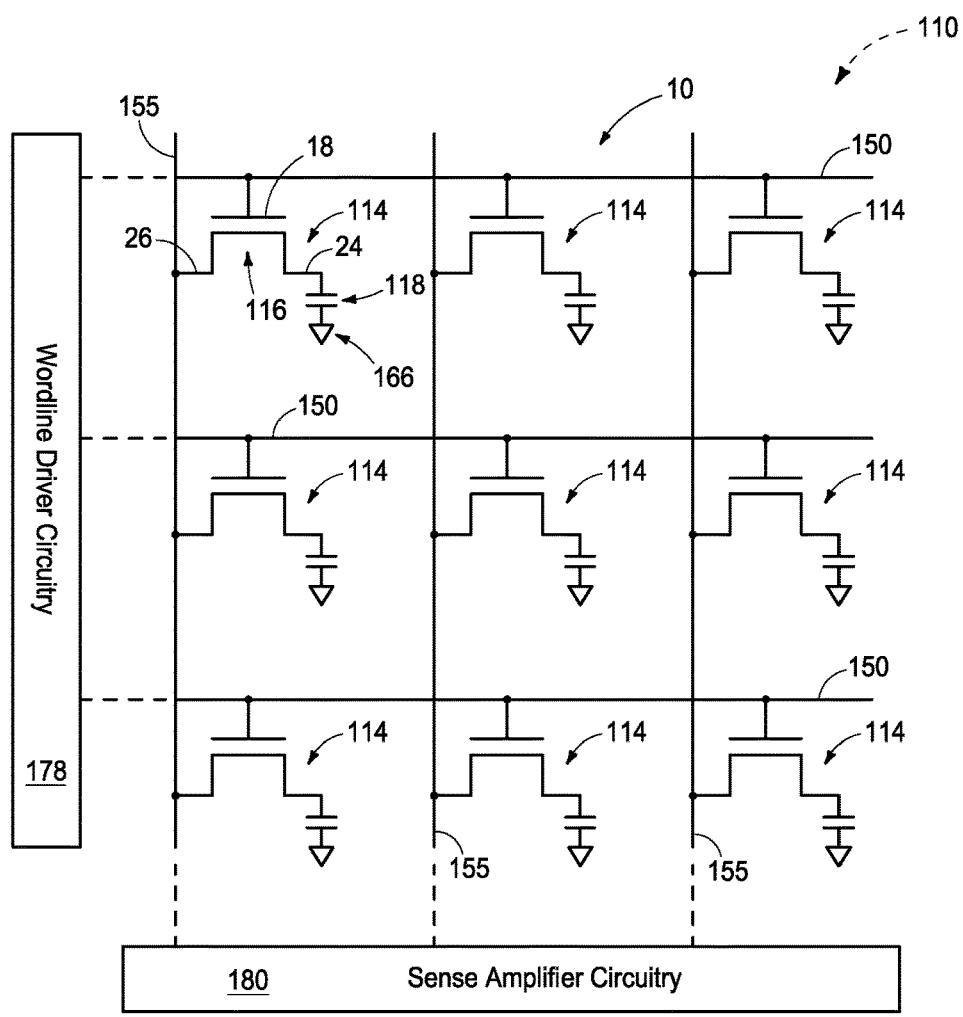
FIG. 16 is a diagrammatic schematic and structural view of DRAM circuitry in accordance with an embodiment of the invention.

FIG. 16 diagrammatically and schematically illustrates a portion of DRAM circuitry 110 in accordance with an aspect of the invention in which a recessed access device 116 comprises a part thereof. Like numerals from the above-described embodiments are used. Circuitry 110 comprises a memory array 10 comprising memory cells 114 individually comprising a recessed access device 116 and a charge-storage device 118. Transistors 116 individually comprise two source/drain regions 24, 26 having a gate 18 therebetween that is part of one of multiple wordlines 150 of memory array 10. One of the source/drain regions (e.g., 24) is electrically coupled (e.g., directly electrically coupled) to one of charge-storage devices 118. The other of the source/drain regions (e.g., 26) is electrically coupled to one of multiple sense lines 155 of memory array 10. Example charge-storage devices 118 as a capacitor has one of its nodes directly electrically coupled to source/drain region 24 of a recessed access device transistor 116 and another node directly electrically coupled to a cell plate 166. Example cell plate 166 may be at any suitable reference voltage, including by way of example, 0V, a power supply voltage $V_{CC}$, one half of $V_{CC}$, or the like, depending upon application. DRAM circuitry 110 comprises peripheral circuitry comprising, for example, wordline-driver circuitry 178 and sense-line-amplifier circuitry 180. Wordlines 150 extend from memory array 10 to wordline-driver circuitry 178 and sense lines 155 extend from memory array 10 to sense-line-amplifier circuitry 180. By way of example, the peripheral circuitry may be wholly laterally aside memory array 10. Such may be partially laterally aside memory array 10 and/or wholly or partially above or below memory array 10. Regardless, additional peripheral circuitry may be provided (not shown). Wordlines 150 and sense lines 155 individually comprise one or more conductive materials (e.g., metal material) and that may not be the same relative one another.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region.

Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a recessed access device comprises a conductive gate in a trench in semiconductor material. A gate insulator extends along sidewalls and around a bottom of the conductive gate between the conductive gate and the semiconductor material. A pair of source/drain regions are in upper portions of the semiconductor material on opposing lateral sides of the trench. A channel region in the semiconductor material is below the pair of source/drain regions and extends along sidewalls and around a bottom of the trench. The gate insulator comprises a low-k material and a high-k material. The low-k material is characterized by its dielectric constant k being no greater than 4.0. The high-k material is characterized by its dielectric constant k being greater than 4.0. The low-k material extends completely along all of the sidewalls of and directly under the bottom of the conductive gate. The high-k material is laterally-inward of the low-k material and is at least one of (a) and (b), where:
 (a): extending less-than-completely along all of the sidewalls of the conductive gate; and
 (b): not being directly under the bottom of the conductive gate.

In some embodiments, a method of forming a recessed access device comprises forming a trench in semiconductor material. Sidewalls and a bottom of the trench are lined with low-k gate-insulator material. The low-k gate-insulator material is characterized by its dielectric constant k being no greater than 4.0. Sacrificial material is formed in a bottom portion of the trench over the low-k gate-insulator material and over the trench bottom. A high-k gate-insulator material is formed in an upper portion of the trench above the sacrificial material and laterally-inward of the low-k gate-insulator material that is in the upper portion of the trench. The high-k gate-insulator material is characterized by its dielectric constant k being greater than 4.0. The sacrificial material is replaced with a conductive gate that has its top above a bottom of the high-k gate-insulator material. A pair of source/drain regions is formed in upper portions of the semiconductor material on opposing lateral sides of the trench. A channel region is in the semiconductor material below the pair of source/drain regions and extends along the trench sidewalls and around the trench bottom.

In some embodiments, a method of forming a recessed access device comprises forming a trench in semiconductor material. Sidewalls and a bottom of the trench are lined with low-k gate-insulator material. The low-k gate-insulator material is characterized by its dielectric constant k being no greater than 4.0. A high-k gate-insulator material is formed in the trench over sidewalls and directly above a bottom of the low-k gate-insulator material. The high-k gate-insulator material is characterized by its dielectric constant k being greater than 4.0. A conductive gate is formed in the trench over sidewalls and a bottom of the high-k gate-insulator material. The high-k gate-insulator material has a top that is below a top of the conductive gate. A pair of source/drain regions is formed in upper portions of the semiconductor material on opposing lateral sides of the trench. A channel region is in the semiconductor material below the pair of source/drain regions and extends along the trench sidewalls and around the trench bottom.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A recessed access device comprising:
   a conductive gate in a trench in semiconductor material;
   a gate insulator extending along sidewalls and around a bottom of the conductive gate between the conductive gate and the semiconductor material;
   a pair of source/drain regions in upper portions of the semiconductor material on opposing lateral sides of the trench;
   a channel region in the semiconductor material below the pair of source/drain regions extending along sidewalls and around a bottom of the trench;
   the gate insulator comprising a low-k material and a high-k material, the low-k material being characterized by its dielectric constant k being no greater than 4.0, the high-k material being characterized by its dielectric constant k being greater than 4.0, the low-k material extending completely along all of the sidewalls of and directly under the bottom of the conductive gate, the high-k material being laterally-inward of the low-k material and at least one of (a) and (b), where:
     (a): extending less-than-completely along all of the sidewalls of the conductive gate; and
     (b): not being directly under the bottom of the conductive gate;
   comprising the (a);
   the high-k material covers 10% to 95% of the sidewalls of the conductive gate; and
   the high-k material covers less than 50% of the sidewalls of the conductive gate.

2. The recessed access device of claim 1 wherein the high-k material covers 10% to 25% of the sidewalls of the conductive gate.

3. A recessed access device comprising:
   a conductive gate in a trench in semiconductor material;
   a gate insulator extending along sidewalls and around a bottom of the conductive gate between the conductive gate and the semiconductor material;
   a pair of source/drain regions in upper portions of the semiconductor material on opposing lateral sides of the trench;
   a channel region in the semiconductor material below the pair of source/drain regions extending along sidewalls and around a bottom of the trench;
   the gate insulator comprising a low-k material and a high-k material, the low-k material being characterized by its dielectric constant k being no greater than 4.0, the high-k material being characterized by its dielectric constant k being greater than 4.0, the low-k material extending completely along all of the sidewalls of and directly under the bottom of the conductive gate, the high-k material being laterally-inward of the low-k material and at least one of (a) and (b), where:
     (a): extending less-than-completely along all of the sidewalls of the conductive gate; and
     (b): not being directly under the bottom of the conductive gate;
   comprising the (a); and
   comprising the (b).

4. The recessed access device of claim 3 wherein the high-k material extends completely along all of the sidewalls of the conductive gate.

5. A recessed access device comprising:
   a conductive gate in a trench in semiconductor material;
   a gate insulator extending along sidewalls and around a bottom of the conductive gate between the conductive gate and the semiconductor material;
   a pair of source/drain regions in upper portions of the semiconductor material on opposing lateral sides of the trench;
   a channel region in the semiconductor material below the pair of source/drain regions extending along sidewalls and around a bottom of the trench;
   the gate insulator comprising a low-k material and a high-k material, the low-k material being characterized by its dielectric constant k being no greater than 4.0, the high-k material being characterized by its dielectric constant k being greater than 4.0, the low-k material extending completely along all of the sidewalls of and directly under the bottom of the conductive gate, the high-k material being laterally-inward of the low-k material and at least one of (a) and (b), where:
     (a): extending less-than-completely along all of the sidewalls of the conductive gate; and
     (b): not being directly under the bottom of the conductive gate;
   comprising the (a); and
   comprising the (a) and the (b).

6. A recessed access device comprising:
   a conductive gate in a trench in semiconductor material;
   a gate insulator extending along sidewalls and around a bottom of the conductive gate between the conductive gate and the semiconductor material;
   a pair of source/drain regions in upper portions of the semiconductor material on opposing lateral sides of the trench;
   a channel region in the semiconductor material below the pair of source/drain regions extending along sidewalls and around a bottom of the trench;
   the gate insulator comprising a low-k material and a high-k material, the low-k material being characterized by its dielectric constant k being no greater than 4.0, the high-k material being characterized by its dielectric constant k being greater than 4.0, the low-k material extending completely along all of the sidewalls of and directly under the bottom of the conductive gate, the high-k material being laterally-inward of the low-k material and at least one of (a) and (b), where:
     (a): extending less-than-completely along all of the sidewalls of the conductive gate; and
     (b): not being directly under the bottom of the conductive gate;
   comprising the (a); and
   the high-k material is aside a top of the conductive gate at an elevation of the top of the conductive gate.

7. The recessed access device of claim 6 wherein the high-k material has a top that is at the elevation of the top of the conductive gate.

8. The recessed access device of claim 7 wherein the top of the conductive gate and the top of the high-k material are planar and collectively co-planar.

9. The recessed access device of claim 6 wherein the high-k material has a top that is above the elevation of the top of the conductive gate.

10. The recessed access device of claim 9 wherein the low-k material has a top that is above the elevation of the top of the conductive gate.

11. A recessed access device comprising:
 a conductive gate in a trench in semiconductor material;
 a gate insulator extending along sidewalls and around a bottom of the conductive gate between the conductive gate and the semiconductor material;
 a pair of source/drain regions in upper portions of the semiconductor material on opposing lateral sides of the trench;
 a channel region in the semiconductor material below the pair of source/drain regions extending along sidewalls and around a bottom of the trench;
 the gate insulator comprising a low-k material and a high-k material, the low-k material being characterized by its dielectric constant k being no greater than 4.0, the high-k material being characterized by its dielectric constant k being greater than 4.0, the low-k material extending completely along all of the sidewalls of and directly under the bottom of the conductive gate, the high-k material being laterally-inward of the low-k material and at least one of (a) and (b), where:
  (a): extending less-than-completely along all of the sidewalls of the conductive gate; and
  (b): not being directly under the bottom of the conductive gate;
 comprising the (a); and
 the high-k material is thinner than the low-k material.

12. The recessed access device of claim 11 wherein the high-k material has maximum lateral thickness that is 1% to 60% of that of the low-k material.

13. The recessed access device of claim 12 wherein the high-k material has maximum lateral thickness that is no more than 50% of that of the low-k material.

14. The recessed access device of claim 13 wherein the high-k material has maximum lateral thickness that is no more than 10% of that of the low-k material.

* * * * *